(12) United States Patent
Martin et al.

(10) Patent No.: US 10,181,835 B2
(45) Date of Patent: Jan. 15, 2019

(54) BULK ACOUSTIC RESONATOR DEVICES AND PROCESSES FOR FABRICATING BULK ACOUSTIC RESONATOR DEVICES

(71) Applicant: Avago Technologies General IP (Singapore) Pte. Ltd., Singapore (SG)

(72) Inventors: David Thomas Martin, Fort Collins, CO (US); Keri Liane Williams, Fort Collins, CO (US); Sean Hansen, Sunnyvale, CA (US); Lori Ann Callaghan, Menlo Park, CA (US); Lovell Harold Camnitz, Santa Clara, CA (US); Alexia Polland Kekoa, Fremont, CA (US); Kun Wang, Sunnyvale, CA (US); Bernhard Ulrich Koelle, Milpitas, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 399 days.

(21) Appl. No.: 15/169,031

(22) Filed: May 31, 2016

(65) Prior Publication Data

US 2017/0346462 A1    Nov. 30, 2017

(51) Int. Cl.
| | |
|---|---|
| *H03H 9/17* | (2006.01) |
| *H01L 41/22* | (2013.01) |
| *H01L 41/09* | (2006.01) |
| *H03H 9/02* | (2006.01) |
| *H03H 3/02* | (2006.01) |

(52) U.S. Cl.
CPC ............. *H03H 9/17* (2013.01); *H03H 3/02* (2013.01); *H03H 9/02157* (2013.01)

(58) Field of Classification Search
CPC ......... H03H 9/17; H03H 9/02157; H03H 3/02
USPC .......................................................... 310/365
See application file for complete search history.

(56) References Cited

U.S. PATENT DOCUMENTS

| | | | |
|---|---|---|---|
| 7,187,253 B2 | 3/2007 | Sano et al. | |
| 7,275,292 B2 | 10/2007 | Ruby et al. | |
| 8,610,333 B2 | 12/2013 | Pang et al. | |
| 2004/0125970 A1* | 7/2004 | Kawakubo | H03H 3/02 381/190 |
| 2013/0201258 A1* | 8/2013 | Hirai | H01L 41/0471 347/70 |
| 2018/0062619 A1* | 3/2018 | Yi | H03H 3/02 |

* cited by examiner

*Primary Examiner* — Thomas Dougherty

(57) ABSTRACT

In a bulk acoustic resonator device, at least one additional metal feature is formed on a top surface of the bottom electrode at a location at which the bottom electrode electrical contact will subsequently be formed, thereby thickening the metal at the location below where the piezoelectric material layer will be etched to form the opening for the bottom electrode electrical contact. Consequently, even though some of the metal of the additional metal feature and/or of the bottom electrode will be removed during the process of etching the opening in the piezoelectric material layer, the bottom electrode will always retain sufficient thickness after the piezoelectric material layer is etched.

24 Claims, 7 Drawing Sheets

BULK ACOUSTIC RESONATOR DEVICES AND PROCESSES FOR FABRICATING BULK ACOUSTIC RESONATOR DEVICES

TECHNICAL FIELD OF THE INVENTION

The invention relates to bulk acoustic resonator devices.

BACKGROUND OF THE INVENTION

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that is capable meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Because the velocity of sound is many orders of magnitude smaller than the velocity of light, the resulting resonator can be quite compact. Resonators for applications in the gigahertz (GHz) range may be constructed with physical dimensions less than 100 microns in diameter and few microns in thickness.

At the heart of Thin Film Bulk Acoustic Resonators (FBARs) and Stacked Thin Film Bulk Wave Acoustic Resonators and Filters (SBARs) is a thin sputtered piezoelectric film having a thickness on the order of one to two microns. Electrodes on top and bottom sandwich the piezoelectric acting as electrical leads to provide an electric field through the piezoelectric. The piezoelectric, in turn, converts a fraction of the electric field into a mechanical field. A time varying "stress/strain" field will form in response to a time-varying applied electric field.

To act as a resonator, the sandwiched piezoelectric film is suspended in air to provide the air/crystal interface that traps the sound waves within the film. The device is normally fabricated on the surface of a substrate by depositing a bottom electrode, the PZ layer, and then the top electrode. Hence, an air/crystal interface is already present on the topside of the device. A second air/crystal interface is provided on the bottom side of the device.

FIG. 1 illustrates a cross-sectional view of a typical bulk acoustic resonator device 2 having a substrate 3, a bottom electrode 4 disposed on the top surface of the substrate 3, a layer of PZ material 5 covering the bottom electrode 4 and portions of the top surface of the substrate 3, a top electrode 6 disposed on top of the PZ material layer 5, and a bottom electrode electrical contact 7 disposed in an opening of the PZ material layer 5 and in contact with the bottom electrode 4. The box 8 represents the aforementioned second air/crystal interface provided on the bottom side of the device 2, also referred to sometimes as the "swimming pool." The active region of the PZ material layer 5 is the portion of the layer 5 above the swimming pool 8.

Typically, the bottom electrode 4 is exposed during the process of etching the opening in the PZ material layer 5 in which the bottom electrode electrical contact 7 will be formed. Because the metal of the bottom electrode 4 will not have an infinite selectivity to the etchant, a portion of the metal of the bottom electrode 4 will be consumed during the etch process. For the typical bulk acoustic resonator design shown in FIG. 1, there is typically sufficient bottom electrode thickness after the PZ material layer 5 has etched to form the opening for the bottom electrode electrical contact 7. This is not always the case, especially for very high frequency bulk acoustic resonator devices that us very thin film thicknesses.

FIG. 2 illustrates a cross-sectional view of a bulk acoustic resonator device 12 having a substrate 13, a bottom electrode 14 disposed on the top surface of the substrate 13, a layer of PZ material 15 covering the bottom electrode 14 and portions of the top surface of the substrate 13, a top electrode 16 disposed on top of the PZ material layer 15, and a bottom electrode electrical contact 17 disposed in an opening of the PZ material layer 15 and in contact with the bottom electrode 14. The box 18 represents the aforementioned second air/crystal interface provided on the bottom side of the device 12.

The device 12 shown in FIG. 2 is identical to the device 2 shown in FIG. 1 except that the film stack is thinner such that there is insufficient bottom electrode 14 remaining after the process of etching the opening in the PZ material layer 15 in which the bottom electrode electrical contact 17 will be formed. The insufficient amount of bottom electrode 14 remaining after the etching process can cause a variety of problems, including, for example, poor electrical contact, high series resistance and reliability issues. The etch rate is a fixed selectivity between the metal of the bottom electrode 14 and the PZ material of layer 15. Therefore, when the aspect ratio between the thickness of the PZ material layer 15 and the thickness of the bottom electrode 14 is large, an insufficient amount of bottom electrode 14 can remain after the etching process. In fact, for a very large aspect ratio, it is possible for the etch process to etch completely through the bottom electrode 14.

Accordingly, a need exists for a process to manufacture bulk acoustic resonator devices that ensures that there is sufficient bottom electrode material remaining after performing the etching process to form the opening in the PZ material layer for the bottom electrode electrical contact.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF AN ILLUSTRATIVE EMBODIMENT

Figure 1:
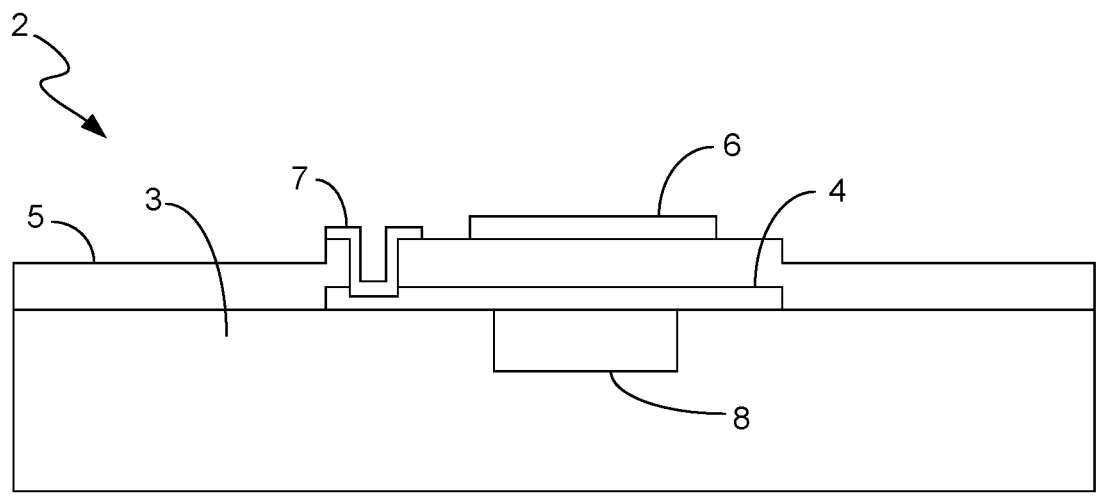
FIG. 1 illustrates a cross-sectional view of a typical bulk acoustic resonator device having a bottom electrode that retains sufficient thickness after the PZ material layer is etched to form the opening for the bottom electrode electrical contact.
Figure 2:
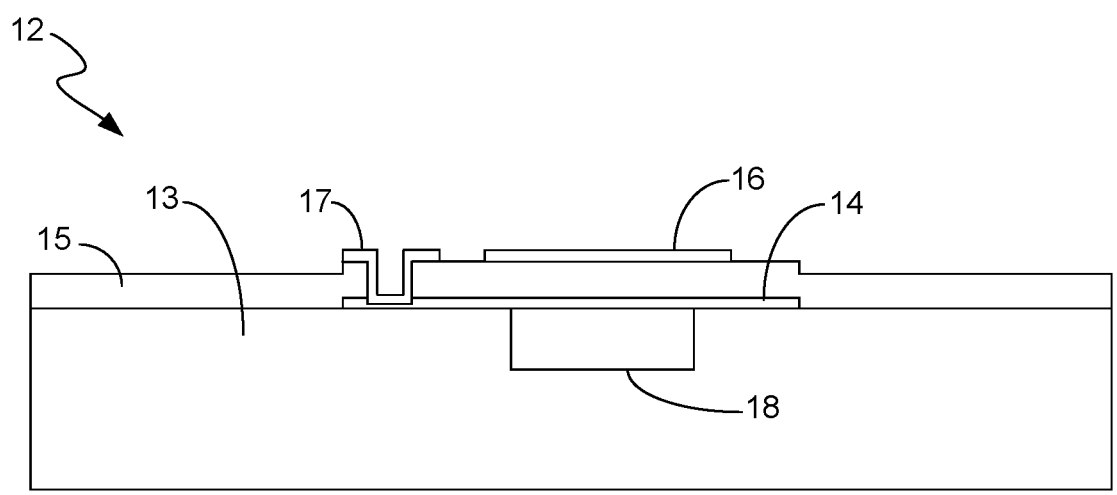
FIG. 2 illustrates a cross-sectional view of a typical bulk acoustic resonator device having a bottom electrode that does not retain sufficient thickness after the PZ material layer is etched to form the opening for the bottom electrode electrical contact.

In accordance with illustrative, or exemplary, embodiments described herein, at least one additional metal feature is formed on a top surface of the bottom electrode at a location at which the bottom electrode electrical contact will subsequently be formed, thereby thickening the metal at the location below where the PZ material layer will be etched to form the opening for the bottom electrode electrical contact. Consequently, even though some of the metal of the additional metal feature and/or of the bottom electrode will be removed during the process of etching the opening in the PZ material layer, the bottom electrode will always retain sufficient thickness after the PZ material layer is etched. The additional metal feature may be formed by a process that is independent of other processes that are used to fabricate the bulk acoustic resonator device or it may be formed during a process that is used to form other metal features of the device at other locations, e.g., during the formation of mass load metal.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known process, steps or devices may be omitted so as to not obscure the description of the example embodiments. Such methods and apparatuses are clearly within the scope of the present teachings. It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described.

For purposes of describing features and elements of the bulk acoustic resonators of the invention, relative positions and orientations of features and elements of the bulk acoustic resonators will be described with reference to X, Y and Z directions of an X, Y, Z Cartesian coordinate system. However, as will be understood by those of skill in the art, directions, positions and orientations of features and elements may not be perfectly aligned with, parallel to or perpendicular to one of these axes. For example, when layers are formed in bulk acoustic resonator devices, the upper and lower surfaces of the layers may not be perfectly planar surfaces and they may not be perfectly parallel to one another. Likewise, side walls of layers or other features may not be perfectly perpendicular to their upper and lower surfaces or perfectly parallel to one another. Also, features and elements can have walls or surfaces that slope slightly, but for ease of illustration are depicted as being straight or planar. Therefore, as will be understood by persons of skill in the art, references to X, Y and Z directions or dimensions are intended to provide a general understanding of the orientations and positions of features and elements relative to one another and are not be construed in a limiting sense.

Figure 3:
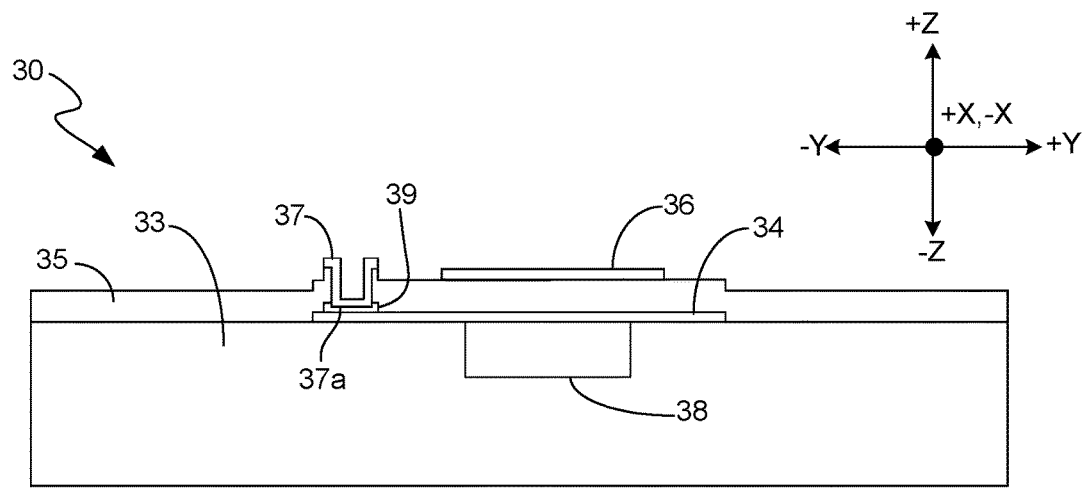
FIG. 3 illustrates a cross-sectional view of a bulk acoustic resonator device in accordance with an exemplary embodiment.

FIG. 3 illustrates a cross-sectional view of a bulk acoustic resonator device 30 in accordance with an exemplary embodiment. The device 30 includes a substrate 33, a bottom electrode 34 disposed on the top surface of the substrate 33, a layer of PZ material 35 covering the bottom electrode 34 and portions of the top surface of the substrate 33, a top electrode 36 disposed on top of the PZ material layer 35, and a bottom electrode electrical contact 37 disposed in an opening formed in the PZ material layer 35. The device 30 includes at least one additional metal feature 39 that is in contact with the bottom electrode 34 and with the bottom electrode electrical contact 37. The box 38 represents the aforementioned second air/crystal interface, or swimming pool. Known processes are used to form the components 33-36 of the bulk acoustic resonator device 30. Typically, a suitable dielectric material seed layer (e.g., a thin layer of aluminum nitride (AlN)) is disposed in between the bottom electrode 34 and the top surface of the substrate 33 to aid the growth of both the bottom electrode 34 and the PZ material layer 35 such that they have good crystallographic orientation in order to provide a good PZ coupling coefficient. The seed layer (not shown) typically has a thickness of around 300 Angstrom and is subsequently etched away in areas that are not covered by the bottom electrode 34. For clarity, the seed layer is not shown in FIG. 3.

The additional metal feature 39, in accordance with this embodiment, is a layer of metal that is deposited at the location shown on top of the metal layer that comprises the bottom electrode 34. The metal of which the additional metal feature 39 is made may be the same type of metal as the metal of which the bottom electrode 34 is made (e.g., molybdenum (Mo)) or they may be made of different types of metal. The additional metal feature 39 is typically formed by first patterning a layer of photoresist (not shown) on the top surface of the bottom electrode 34 into a mask and then using a metal deposition process to deposit a metal layer on the unmasked portions of the top surface of the bottom metal electrode 34. A lift off process is then performed to remove the photoresist mask and the metal disposed on top of the mask.

The additional metal feature 39 has a thickness in the Z direction that is preselected such that when the PZ material layer 35 is etched to form the opening for the bottom electrode electrical contact 37, a sufficient amount of the bottom electrode 34 remains after the etch process is complete. In accordance with this embodiment, the process of etching the PZ material layer 35 to form the opening for the bottom electrode electrical contact 37 does not etch the entire way through the additional metal feature 39 in the −Z direction. Therefore, a lower surface 37a of the bottom electrode electrical contact 37 is seated in the metal of the additional metal feature 39. Therefore, in accordance with this embodiment, the additional metal feature 39 acts as an etch stop such that the etch does not extend into the metal of the bottom electrode 34 in the −Z direction. As will be described below with reference to FIG. 4, this is not necessarily always the case.

Figure 4:
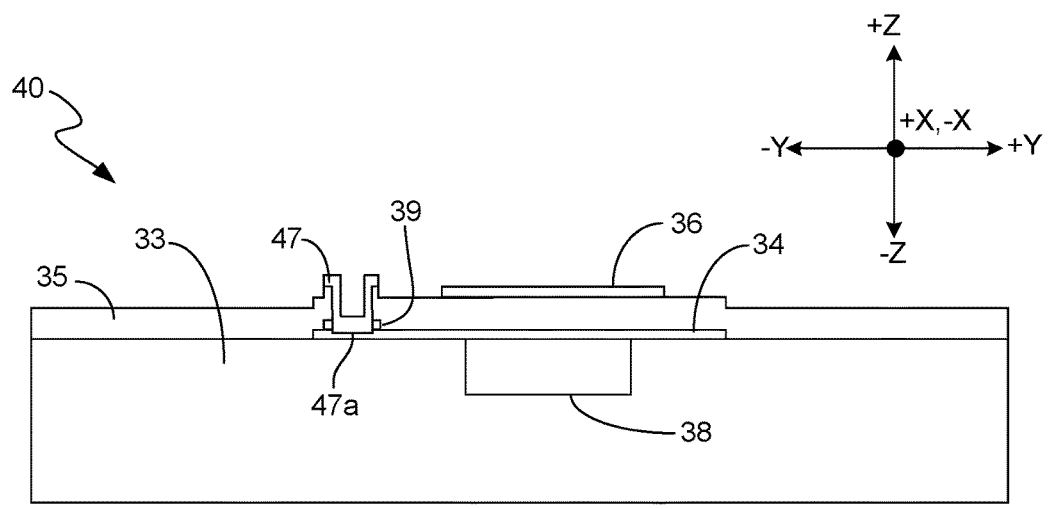
FIG. 4 illustrates a cross-sectional view of a bulk acoustic resonator device in accordance with an exemplary embodiment.

FIG. 4 illustrates a cross-sectional view of a bulk acoustic resonator device 40 in accordance with an exemplary embodiment. The bulk acoustic resonator device 40 is identical to the bulk acoustic resonator device 30 shown in FIG. 3 except that the process of etching the opening in the PZ material layer 35 for the bottom electrode electrical contact 47 etches the entire way through the thickness of the additional metal feature 39 in the −Z direction. Consequently, a lower surface 47a of the bottom electrode electrical contact 47 is seated in the metal of the bottom electrode 34 rather than in the metal of the additional metal feature 39.

The inclusion of the additional metal feature 39 in the acoustic resonator devices 30 and 40 shown in FIGS. 3 and 4, respectively, ensures that the bottom electrode 34 will always have sufficient thickness after etching of the PZ material layer 35 to form the openings for the bottom electrode electrical contacts 37 and 47, respectively. In this way, the aforementioned problems, including, for example, poor electrical contact, high series resistance and reliability issues, are prevented.

Figure 5:
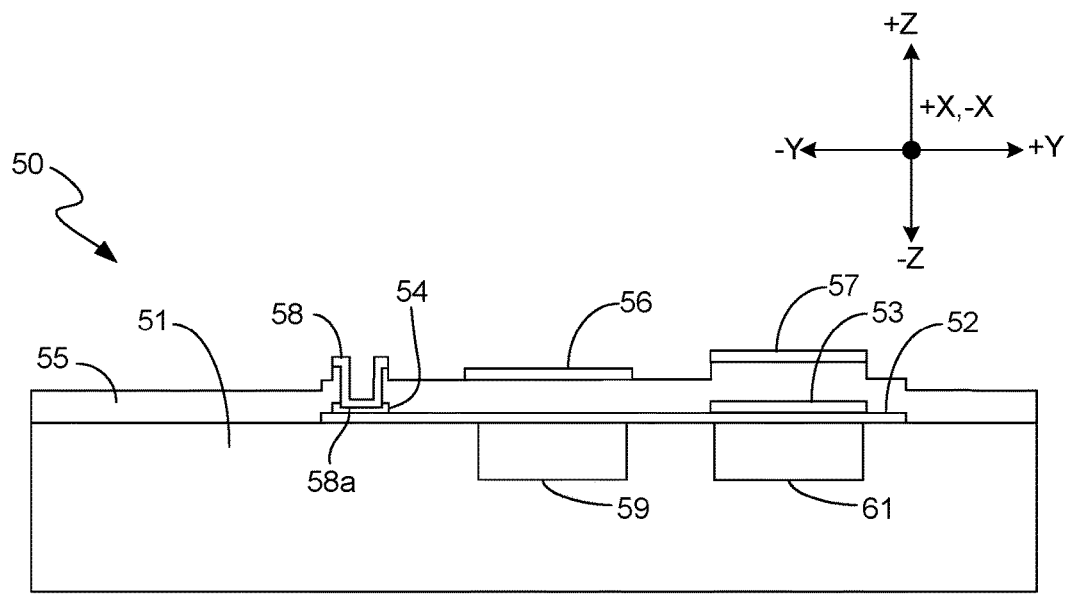
FIG. 5 illustrates a cross-sectional view of a bulk acoustic resonator device in accordance with an exemplary embodiment.

FIG. 5 illustrates a cross-sectional view of a bulk acoustic resonator device 50 in accordance with an exemplary embodiment. The device 50 includes a substrate 51, a bottom electrode 52 disposed on the top surface of the substrate 51, a mass load metal 53 disposed on the top surface of the bottom electrode 52, an additional metal feature 54 disposed on the top surface of the bottom electrode 52, a layer of PZ material 55 covering the bottom electrode 52, the mass load metal 53 and portions of the top surface of the substrate 51, first and second top electrodes 56 and 57, respectively, disposed on top of the PZ material layer 55, and a bottom electrode electrical contact 58 disposed in an opening formed in the PZ material layer 55 in contact with the additional metal feature 54. In accordance with this embodiment, the bottom electrode electrical contact 58 has a bottom surface 58a that is seated in the metal of the additional metal feature 54, and thus the etch stops before reaching the bottom electrode 52 in this example.

The additional metal feature 54 may be identical to the additional metal feature 39 shown in FIGS. 3 and 4. The boxes 59 and 61 represent first and second swimming pools, respectively. The first and second top electrodes 56 and 57, respectively, are generally aligned in the X and Y dimensions with the first and second swimming pools 59 and 61, respectively. The mass load metal 53, the second top electrode 57 and the second swimming pool 61 are generally aligned with one another in the X and Y dimensions.

The first top electrode 56, the first swimming pool 59 and the PZ material layer aligned therewith in the X and Y dimensions form a series resonator. The second top electrode 57, the second swimming pool 61, the mass load metal 53, and the PZ material layer aligned therewith in the X and Y dimensions form a shunt resonator. The mass load metal 53 lowers the resonance frequency of the shunt resonator relative to the series resonator, while also reducing the electrical losses of the shunt resonator due to the increase in the metal thickness of the bottom electrode 52.

Because the additional metal feature 54 and the mass load metal 53 are disposed on the top surface of the bottom electrode 52, if the same metal (e.g., Mo) is used for the additional metal feature 54 and the mass load metal 53, and if they are to have the same thickness in the Z dimension, then the same process that is used to form the mass load metal 53 can be used to simultaneously form the additional metal feature 54.

The mass load metal 53 is typically formed by first patterning a layer of photoresist (not shown) on the top surface of the bottom electrode 52 into a mask and then using a metal deposition process to deposit a metal layer on the unmasked portions of the top surface of the bottom electrode 52. A lift off process is then performed to remove the photoresist mask and the metal disposed on top of the mask. In accordance with an embodiment in which the additional metal feature 54 and the mass load metal 53 are to be made of the same type of metal and to have the same thickness, the photoresist mask would include an opening at the location at which the additional metal feature 54 is to be formed such that the metal deposition process that is used to form the mass load metal 53 simultaneously deposits the additional metal feature 54. Therefore, the additional metal feature 54 is formed without adding another processing step.

Figure 6:
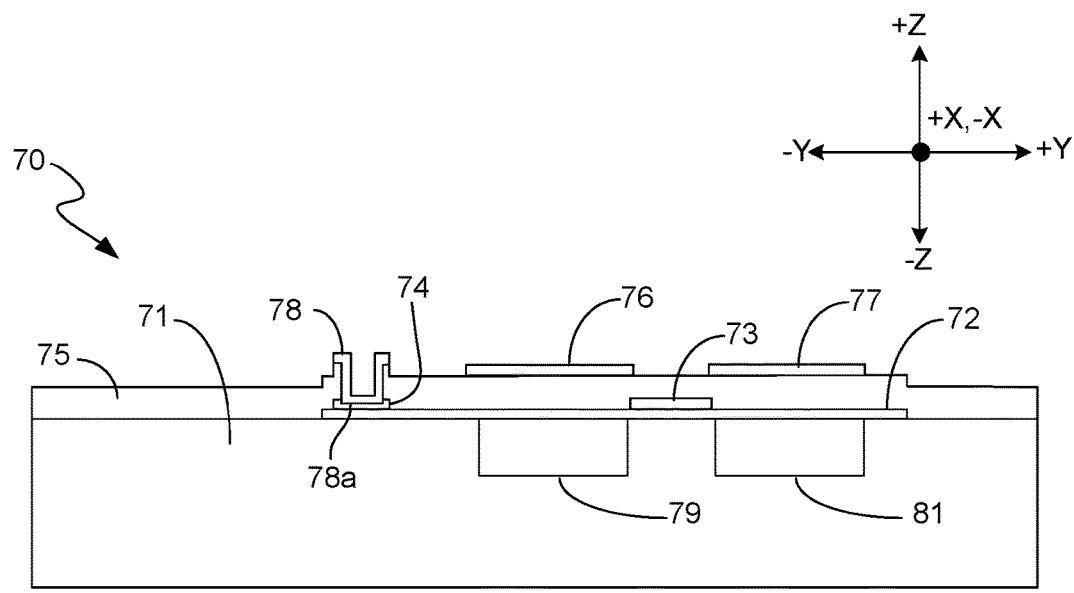
FIG. 6 illustrates a cross-sectional view of a bulk acoustic resonator device in accordance with an exemplary embodiment.

FIG. 6 illustrates a cross-sectional view of a bulk acoustic resonator device 70 in accordance with an exemplary embodiment. The device 70 includes a substrate 71, a bottom electrode 72 disposed on the top surface of the substrate 71, a bottom electrode thickness adder 73 disposed on the top surface of the bottom electrode 72, an additional metal feature 74 disposed on the top surface of the bottom electrode 72, a layer of PZ material 75 covering the bottom electrode 72, the bottom electrode thickness adder 73 and portions of the top surface of the substrate 71, first and second top electrodes 76 and 77, respectively, disposed on top of the PZ material layer 75, and a bottom electrode electrical contact 78 disposed in an opening formed in the PZ material layer 75 in contact with the additional metal feature 74. In accordance with this embodiment, the bottom electrode electrical contact 78 has a bottom surface 78a that is seated in the metal of the additional metal feature 74, and thus the etch stops before reaching the bottom electrode 72 in this example.

The additional metal feature 74 may be identical to the additional metal feature 54 shown in FIG. 5. The boxes 79 and 81 represent first and second swimming pools, respectively. The first and second top electrodes 76 and 77, respectively, are generally aligned in the X and Y dimensions with the first and second swimming pools 79 and 81, respectively.

The first top electrode 76, the first swimming pool 79 and the PZ material layer aligned therewith in the X and Y dimensions form a first resonator. The second top electrode 77, the second swimming pool 81 and the portion of the PZ material layer 75 that is aligned therewith in the X and Y dimensions form a second resonator. In the X, Y dimensions, the bottom electrode thickness adder 73 is located in between the first and second resonators.

The bottom electrode thickness adder 73 is made of metal and is used to increase the thickness of the bottom electrode 72 in the area that interconnects the first and second resonators in order to decrease the resistance of the bottom electrode 72 in the interconnecting area. Because the additional metal feature 74 and the bottom electrode thickness adder 73 are disposed on the top surface of the bottom electrode 72, if the same metal (e.g., Mo) is used for the additional metal feature 74 and the bottom electrode thickness adder 73, and if they are to have the same thickness in the Z dimension, then the same process that is used to form the bottom electrode thickness adder 73 can be used to simultaneously form the additional metal feature 74. Therefore, the additional metal feature 74 can be formed without adding another processing step.

The bottom electrode thickness adder 73 is typically formed by first patterning a layer of photoresist (not shown) on the top surface of the bottom electrode 72 into a mask and then using a metal deposition process to deposit a metal layer on the unmasked portions of the top surface of the bottom electrode 72. A lift off process is then performed to remove the photoresist mask and the metal disposed on top of the mask. In accordance with an embodiment in which the additional metal feature 74 and the bottom electrode thickness adder 73 are to be made of the same type of metal and to have the same thickness, the photoresist mask would include an opening at the location at which the additional metal feature 74 is to be formed such that the metal deposition process that is used to form the bottom electrode thickness adder 73 simultaneously forms the additional metal feature 74.

Figure 7:
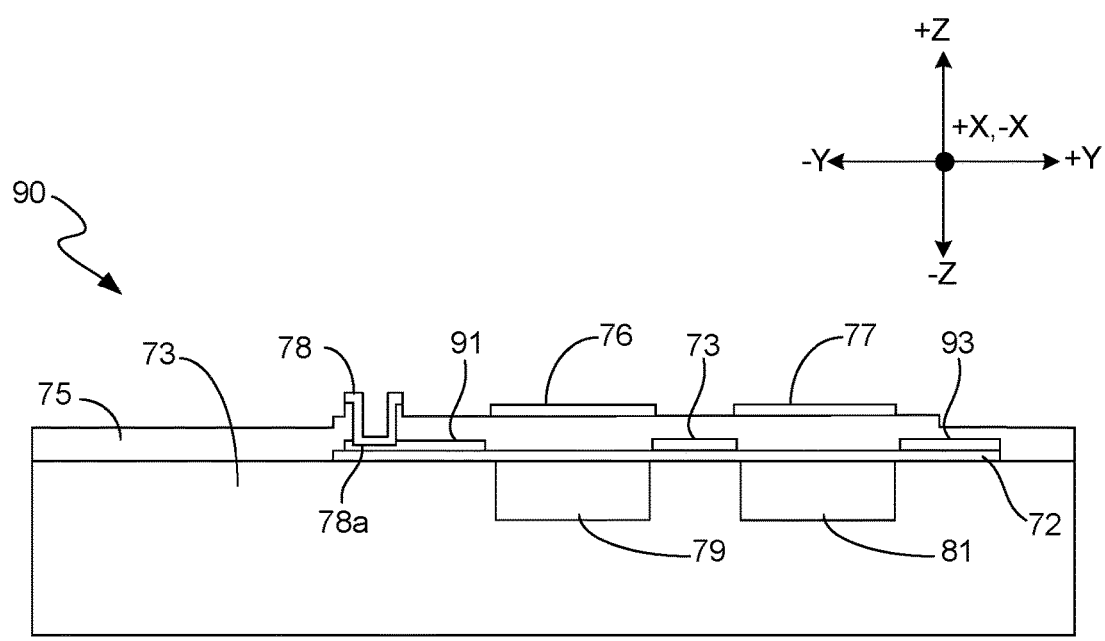
FIG. 7 illustrates a cross-sectional view of a bulk acoustic resonator device in accordance with an exemplary embodiment.

FIG. 7 illustrates a cross-sectional view of a bulk acoustic resonator device 90 that is identical to the bulk resonator device 70 shown in FIG. 6 except that it includes an additional bottom electrode thickness adder 93 and the additional metal feature 91 is longer than the additional metal feature 74. The additional metal feature 91 has been extended in length in the +Y direction so that it extends until just before it reaches the active region of the first resonator. The additional metal feature 91 performs the function described above of ensuring that the bottom electrode 72 has sufficient thickness after the etch process has been performed on the PZ material layer 75, but serves the additional function of acting as a bottom electrode thickness adder to decrease the resistance of the bottom electrode 72 outside of the active region of the PZ material layer 75 above the first swimming pool 79. The bottom electrode thickness adders 73 and 93 serve the functions of decreasing the resistance of the bottom electrode 72 outside of the active regions of the portions of the PZ material layer 75 that are above the swimming pools 79 and 81.

As with the embodiments described above with reference to FIGS. 5 and 6, with the embodiment shown in FIG. 7, the additional metal feature 91 can be formed simultaneously with the formation of the bottom electrode thickness adders 73 and 93 if they are all to have the same thickness and are to be made of the same metal. Therefore, the additional metal feature 91 can be formed without adding a process step to the fabrication process. In addition, the additional metal feature 91 can serve multiple functions. Assuming that all of the features 91, 73 and 93 are to be formed on the same metal and have the same thickness, they are formed by first patterning a layer of photoresist (not shown) on the top surface of the bottom electrode 72 into a mask having openings therein where the features 91, 73 and 93 are to be formed. A metal deposition process is then performed to deposit a metal layer on the unmasked portions of the top surface of the bottom electrode 72. A lift off process is then performed to remove the photoresist mask and the metal disposed on top of it.

The fabrication process that may be used to form the bulk acoustic resonator devices shown in FIGS. 3-7 involves a number of process steps that are known, except for forming the additional metal features 39 (FIGS. 3 and 4), 54 (FIG. 5), 74 (FIG. 6), and 91 (FIG. 7). U.S. Pat. No. 7,275,292 to Ruby, et al. (hereinafter "the '292 patent"), which is owned by the assignee of the present application and which is hereby incorporated by reference herein in its entirety, describes the process steps for fabricating bulk acoustic resonator devices of the type shown in FIGS. 3-7. In the interest of brevity, rather than describing those process steps herein in detail, only the process steps associated with forming the additional metal features such as features 39, 54, 74 and 91, for example, will be described herein. Persons of skill in the art will understand the manner in which the processes described in '292 patent can be altered to form the additional metal features.

Figure 8A:
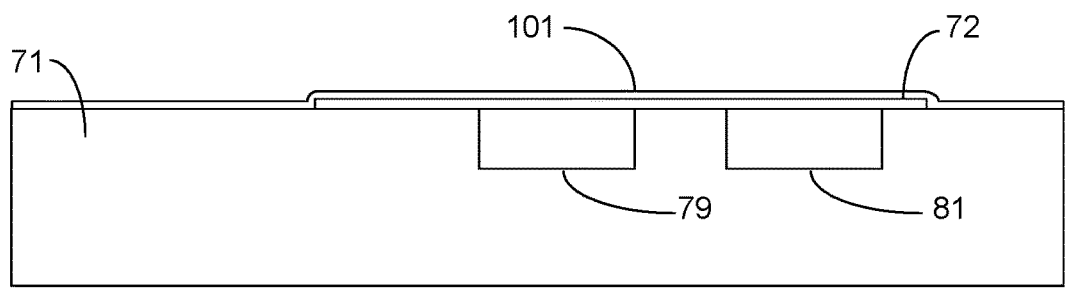
FIG. 8A-8D illustrate steps of a fabrication process for fabricating the bulk acoustic resonator device shown in FIG. 6 in accordance with an exemplary embodiment.
Figure 8B:
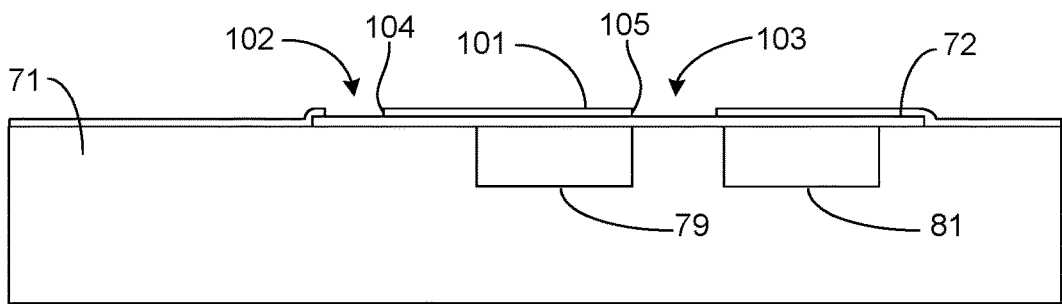
Figure 8C:
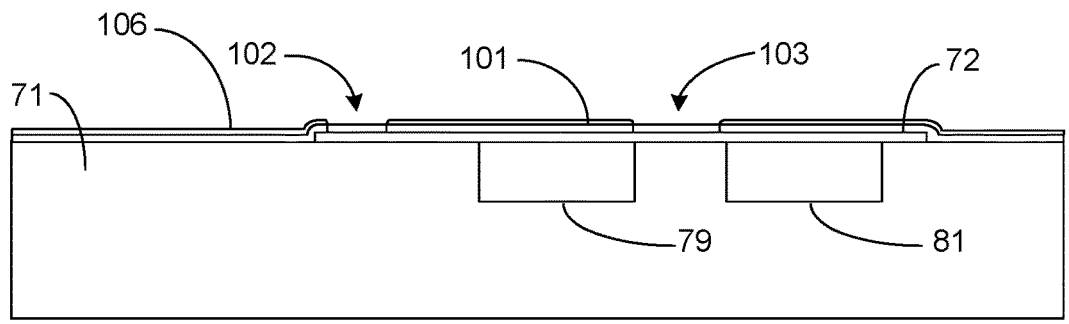
Figure 8D:
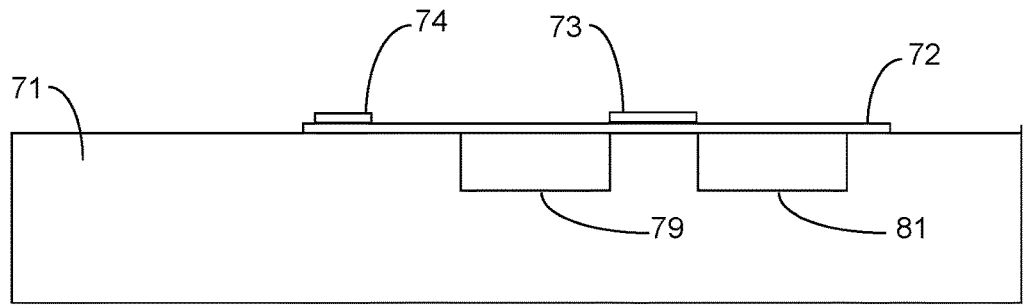

FIG. 8A illustrates a stage of the fabrication process for fabricating the bulk acoustic resonator device 70 shown in FIG. 6 that occurs after the swimming pools 79 and 81 have been formed in the substrate and after the bottom electrode 72 has been patterned into the shape shown in FIGS. 6 and 8A. As indicated above, a suitable dielectric material seed layer, such as AlN (not shown for clarity) is typically disposed in between the bottom electrode 72 and the top surface of the substrate 71. As shown in FIG. 8A, a layer of photoresist 101 is deposited onto the top surface of the substrate 71 that covers the bottom electrode 72. With reference to FIG. 8B, selected areas 102 and 103 of the photoresist layer 101 are exposed to radiation and developed away, leaving openings 104 and 105, respectively, in the photoresist layer 101 at locations where the additional metal feature 74 (FIG. 6) and the bottom electrode thickness adder 73 (FIG. 6) will subsequently be formed. The patterned photoresist layer 101 is now a mask. With reference to FIG. 8C, a metal deposition process is then performed to deposit a metal layer 106 on the unmasked portions of the top surface of the bottom electrode 72. With reference to FIG. 8D, the photoresist mask 101, along with the metal 106 disposed on top of it, is then stripped away leaving the additional metal feature 74 and the bottom electrode thickness adder 73 disposed on the top surface of the bottom electrode 72. Additional processing steps described in the '292 patent are then performed to complete the bulk acoustic resonator device 70 shown in FIG. 6. The process described above with reference to FIGS. 8A-8D in combination with the process steps disclosed in the '292 patent can similarly be performed to fabricate the bulk acoustic resonator devices 30, 40, 50 and 90 shown in FIGS. 3, 4, 5 and 7, respectively.

The bulk acoustic resonator devices shown in FIGS. 3-7 may be Thin Film Bulk Acoustic Resonator (FBAR) devices or Stacked Thin Film Bulk Wave Acoustic Resonator and Filter (SBAR) devices and may be of the membrane type (thin film resonators (TFRs)) or of the mirror type (solidly mounted resonators (SMRs)). Such devices use bulk longitudinal acoustic waves in thin film PZ material. When an electric field is created between the top and bottom electrodes via an impressed voltage, the PZ material converts some of the electrical energy into mechanical energy in the form of sound waves. The sound waves propagate in the same direction as the electric field and reflect off of the electrode/air interfaces. At the mechanical resonance, the device appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact.

Figure 9A:
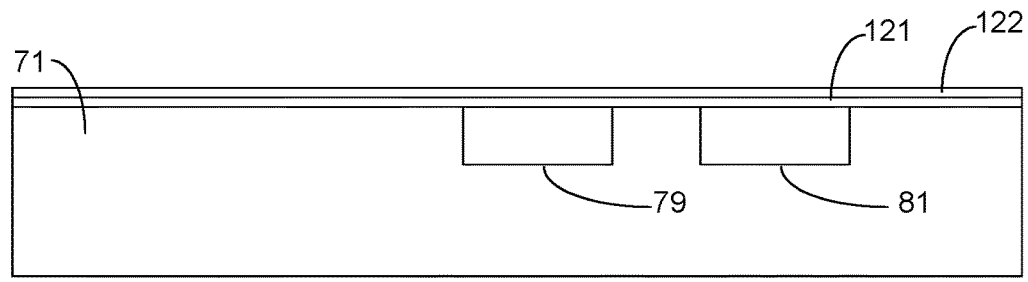
FIG. 9A-9E illustrate steps of a fabrication process for fabricating the bulk acoustic resonator device shown in FIG. 6 in accordance with an exemplary embodiment.
Figure 9B:
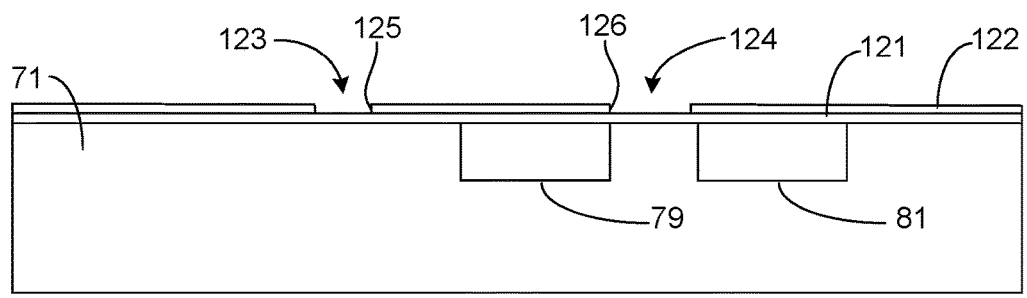

FIG. 9A illustrates a stage of the fabrication process for fabricating the bulk acoustic resonator device 70 shown in FIG. 6 that occurs after the swimming pools 79 and 81 have been formed in the substrate and after the metal layer for the bottom electrode 72 has been deposited, but before the metal layer for the bottom electrode 72 has been patterned into the shape shown in FIG. 6. The process described above with reference to FIGS. 8A-8D assumes that the bottom electrode 72 has already been patterned at the stage of the process depicted in FIG. 8A, but this is not necessarily the case, as will now be described with reference to FIGS. 9A-9E. With reference to FIG. 9A, a layer of photoresist 122 is deposited onto the top surface of the metal layer 121 that will subsequently be patterned into the patterned bottom electrode 72. With reference to FIG. 9B, selected areas 123 and 124 of the photoresist layer 122 are exposed to radiation and developed away, leaving openings 125 and 126, respectively, in the photoresist layer 122 at locations where the additional metal feature 74 (FIG. 6) and the bottom electrode thickness adder 73 (FIG. 6) will subsequently be formed, respectively. The patterned photoresist layer 122 is now a mask.

Figure 9C:
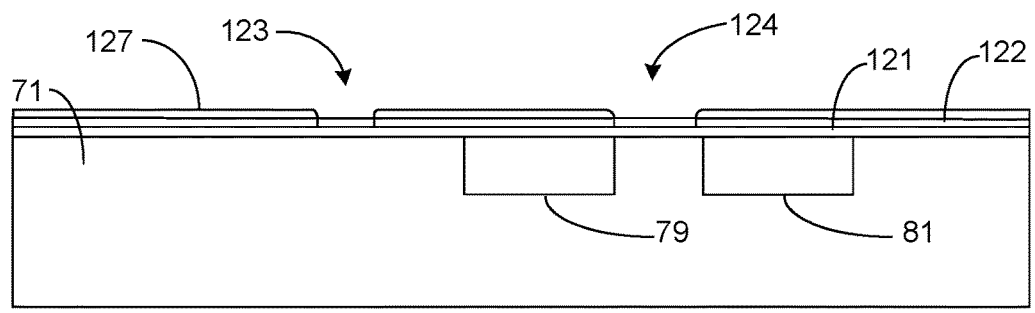
Figure 9D:
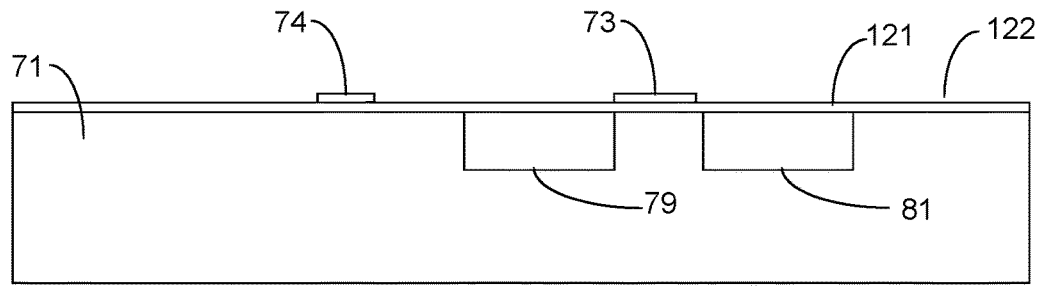
Figure 9E:
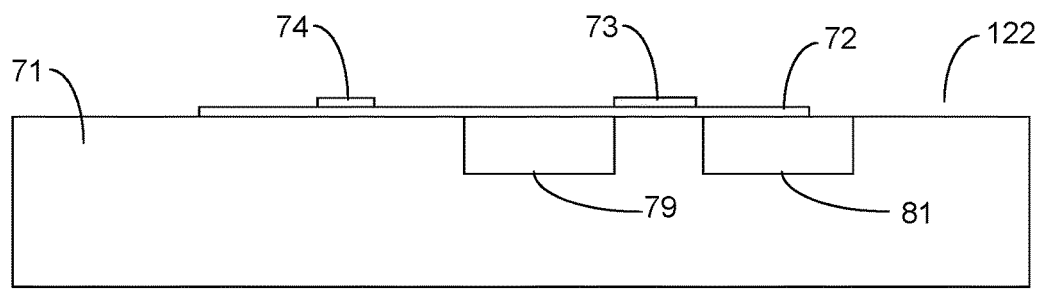

With reference to FIG. 9C, a metal deposition process is then performed to deposit a metal layer 127 on the unmasked portions of the top surface of the metal layer 121. With reference to FIG. 9D, the photoresist mask 122, along with the metal disposed on top of it, is then stripped away leaving the additional metal feature 74 and the bottom electrode thickness adder 73 disposed on the top surface of the metal layer 121. A pattern and etch process is then performed to pattern the metal layer 121 in the bottom electrode 72, as shown in FIG. 9E. As indicated above, a suitable dielectric material seed layer, such as AlN (not shown for clarity) is typically disposed in between the bottom electrode 72 and the top surface of the substrate 71. The process of patterning the metal layer 121 to form the bottom electrode 72 is described in the '292 patent. Additional processing steps described in the '292 patent are then performed to complete the bulk acoustic resonator device 70 shown in FIG. 6. The process described above with reference to FIGS. 9A-9E in combination with the process steps disclosed in the '292 patent can similarly be performed to fabricate the bulk acoustic resonator devices 30, 40, 50 and 90 shown in FIGS. 3, 4, 5 and 7, respectively.

It should be noted that the invention has been described with respect to illustrative embodiments for the purpose of describing the principles and concepts of the invention. The invention is not limited to these embodiments. For example, while the invention has been described with reference to the particular configurations of bulk acoustic resonators shown in FIGS. 3-7, many variations may be made to these configurations, and all such variations are within the scope of the invention, as will be understood by those skilled in the art in view of the description being provided herein. In addition, many variations may be made to the process described above with reference to FIGS. 8A-9E, as will be understood by those of skill in the art in view of the description provided herein. For example, the metal that forms the additional metal feature 74 and the bottom electrode thickness adder 73 may be formed in separate masking and metal deposition processes. Also, the order in which some of the processing steps are performed can be varied. As another example, although the metal that forms the additional metal feature 74 and the bottom electrode thickness adder 73 has been described as being formed by masking and metal deposition processes, any process that is compatible with the other process steps that are used to fabricate bulk acoustic resonator devices may be used for this purpose (e.g., starting with a thicker bottom electrode and etching away portions thereof, electroplating, etc.). Persons of skill in the art will understand that these and other modifications may be made to the illustrative embodiments described above to achieve the goals of the invention and that all such modifications are within the scope of the invention.

What is claimed is:

1. A bulk acoustic wave (BAW) resonator device comprising:
   a substrate having a bottom surface and a top surface;
   a bottom metal electrode disposed on the top surface of the substrate;
   a piezoelectric material layer disposed on the top surface of the substrate and covering the bottom metal electrode, the piezoelectric material layer having at least a first opening formed therein;
   a top metal electrode disposed on a top surface of the piezoelectric material layer;
   a first additional metal feature disposed on a top surface of the bottom metal electrode beneath the first opening at least at a first location on the top surface of the bottom metal electrode, the first additional metal feature having a preselected width and thickness; and
   a metal bottom electrode electrical contact disposed in the first opening and in contact with at least the first additional metal feature to allow an electrical connection to be established with the bottom metal electrode.

2. The BAW resonator device of claim 1, wherein the bottom metal electrode is made of a first metallic material and the first additional metal feature is made of a second metallic material that is different from the first metallic material.

3. The BAW resonator device of claim 1, wherein the bottom metal electrode and the first additional metal feature are made of a first metallic material.

4. The BAW resonator device of claim 1, wherein the metal bottom electrode electrical contact is not in direct contact with the bottom metal electrode, but is electrically coupled with the bottom metal electrode via the first additional metal feature.

5. The BAW resonator device of claim 1, wherein the metal bottom electrode electrical contact extends through the first additional metal feature and is in direct contact with the bottom metal electrode and with the first additional metal feature.

6. The BAW resonator device of claim 1, wherein the first additional metal feature is part of a patterned metal layer that also includes at least one mass load metal of a shunt resonator of the BAW resonator device.

7. The BAW resonator device of claim 1, wherein the first additional metal feature is part of a patterned metal layer that also includes at least one bottom electrode thickness adder used to decrease a resistance of the bottom metal electrode.

8. The BAW resonator device of claim 1, wherein the thickness of the first additional metal feature is preselected to ensure that a sufficient amount of metal of the bottom metal electrode remains after etching the piezoelectric material layer to form the first opening.

9. The BAW resonator device of claim 1, wherein the first additional metal feature covers the first location on the top surface of the bottom metal electrode and extends in a direction parallel to the top surface of the bottom metal electrode to an edge of an active region of the BAW resonator device.

10. A BAW resonator device comprising:
a substrate having a bottom surface and a top surface, the substrate having at least first and second swimming pools therein;
a bottom metal electrode disposed on the top surface of the substrate over at least the first and second swimming pools;
a piezoelectric material layer disposed on the top surface of the substrate and covering the bottom metal electrode, the piezoelectric material layer having at least a first opening formed therein;
a top metal electrode disposed on a top surface of the piezoelectric material layer; and
a first additional metal feature disposed on a top surface of the bottom metal electrode beneath the first opening at least at a first location on the top surface of the bottom metal electrode, the first additional metal feature having a preselected width and thickness;
a second additional metal feature disposed on a top surface of the bottom metal electrode at a second location on the top surface of the bottom metal electrode that is spaced apart from the first location, the second additional metal feature having a preselected width and thickness; and
a metal bottom electrode electrical contact disposed in the first opening and in contact with at least the first additional metal feature to allow an electrical connection to be established with the bottom metal electrode.

11. The BAW resonator device of claim 10, wherein the first and second additional metal features are formed in a same layer of metal.

12. The BAW resonator device of claim 11, wherein the second location is outside of any active region of the BAW resonator device.

13. The BAW resonator device of claim 11, wherein the second location is inside of at least one active region of the BAW resonator device.

14. A process for ensuring that a sufficient amount of metal of a bottom metal electrode of a bulk acoustic wave (BAW) resonator device remains after a first opening is etched in a piezoelectric material layer of the BAW resonator device for forming a metal bottom electrode electrical contact, the process comprising:
providing a substrate having a bottom surface, a top surface and at least a first swimming pool formed therein, the substrate having a patterned or unpatterned bottom metal electrode layer disposed on the top surface of the substrate above the first swimming pool;
forming a first additional metal feature at a first location on a top surface of the patterned or unpatterned bottom metal electrode layer, the first additional metal feature having a preselected width and thickness;
forming the piezoelectric material layer on the top surface of the substrate and covering the patterned or unpatterned bottom metal electrode layer;
forming a top metal electrode on one or more predetermined locations on a top surface of the piezoelectric material layer;
etching through the piezoelectric material layer to form the first opening in the piezoelectric material layer; and
forming a metal bottom electrode electrical contact in the first opening such that the metal bottom electrode electrical contact is in contact with the first additional metal feature.

15. The process of claim 14, wherein the step of etching through the piezoelectric material layer to form the first opening etches through a portion of the first additional metal feature, but does not etch into the patterned or unpatterned bottom metal electrode layer such that the metal bottom electrode electrical contact is in direct contact with the first additional metal feature, but is not in direct contact with the patterned or unpatterned bottom metal electrode layer.

16. The process of claim 14, wherein the step of etching through the piezoelectric layer to form the first opening etches through the first additional metal feature and extends a distance into the patterned or unpatterned bottom metal electrode layer, and wherein the metal bottom electrode electrical contact is in direct contact with the first additional metal feature and the patterned or unpatterned bottom metal electrode layer.

17. The process of claim 14, further comprising:
during the step of forming the first additional metal feature on the top surface of the patterned or unpatterned bottom metal electrode layer, forming a mass load metal at a second location on the top surface of the patterned or unpatterned bottom metal electrode layer, the mass load metal and the first additional metal feature having identical thicknesses and being formed from a same layer of metal.

18. The process of claim 17, wherein the step of forming the first additional metal feature and the mass load metal comprises:
prior to forming the piezoelectric material layer:
forming a mask on the top surface of the patterned or unpatterned bottom metal electrode layer that masks areas of the top surface of the patterned or unpatterned bottom metal electrode layer and that leaves the first and second locations unmasked;
depositing additional metal on the unmasked first and second locations of the top surface of the patterned or unpatterned bottom metal electrode layer; and
stripping away the mask and any metal disposed on top of the mask.

19. The process of claim 14, further comprising:
during the step of forming the first additional metal feature on the top surface of the patterned or unpatterned bottom metal electrode layer, forming a first metal bottom electrode thickness adder at a second location on the top surface of the patterned or unpatterned bottom metal electrode layer, the first metal bottom electrode thickness adder and the first additional metal feature having identical thicknesses and being formed from a same layer of metal.

20. The process of claim 19, wherein the step of forming the first additional metal feature and the first metal bottom electrode thickness adder comprises:
prior to forming the piezoelectric material layer:
forming a mask on the top surface of the patterned or unpatterned bottom metal electrode layer that masks areas of the top surface of the patterned or unpatterned bottom metal electrode that leaves the first and second locations unmasked;
depositing additional metal on the unmasked first and second locations of the top surface of the patterned or unpatterned bottom metal electrode layer; and
stripping away the mask and any metal disposed on top of the mask.

21. The process of claim 14, wherein the first additional metal feature is a part of the patterned or unpatterned bottom metal electrode layer, and wherein the step of forming the first additional metal feature includes etching away a portion of the patterned or unpatterned bottom metal electrode layer outside of the first location to leave the patterned or unpatterned bottom metal electrode layer thicker at the first location than at other locations of the patterned or unpatterned bottom metal electrode layer.

22. The process of claim 19, further comprising:

during the step of forming the first additional metal feature and the first metal bottom electrode thickness adder on the top surface of the patterned or unpatterned bottom metal electrode layer at the first and second locations, respectively, forming a second metal bottom electrode thickness adder at a third location on the top surface of the patterned or unpatterned bottom metal electrode layer, the first and second metal bottom electrode thickness adders and the first additional metal feature having identical thicknesses and being formed from a same layer of metal.

23. The process of claim 22, wherein the step of forming the first additional metal feature and the first and second metal bottom electrode thickness adders comprises:

prior to forming the piezoelectric material layer:

forming a mask on the top surface of the patterned or unpatterned bottom metal electrode layer that masks areas of the top surface of the patterned or unpatterned bottom metal electrode layer that leaves the first, second and third locations unmasked;

depositing additional metal on the unmasked first, second and third locations of the top surface of the patterned or unpatterned bottom metal electrode layer; and stripping away the mask and any metal disposed on top of the mask.

24. The process of claim 23, wherein the first additional metal feature covers the first location on the top surface of the patterned or unpatterned bottom metal electrode layer and extends in a direction parallel to the top surface of the patterned or unpatterned bottom metal electrode layer to an edge of an active region of the BAW resonator device.

* * * * *